(12) United States Patent
Bao et al.

(10) Patent No.: US 9,293,523 B2
(45) Date of Patent: Mar. 22, 2016

(54) METHOD OF FORMING III-V CHANNEL

(71) Applicant: Applied Materials, Inc., Santa Clara, CA (US)

(72) Inventors: Xinyu Bao, Mountain View, CA (US); Errol Antonio C. Sanchez, Tracy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 46 days.

(21) Appl. No.: 14/313,086

(22) Filed: Jun. 24, 2014

(65) Prior Publication Data

US 2015/0372097 A1    Dec. 24, 2015

(51) Int. Cl.

| | |
|---|---|
| *H01L 29/06* | (2006.01) |
| *H01L 29/12* | (2006.01) |
| *H01L 29/78* | (2006.01) |
| *H01L 21/18* | (2006.01) |
| *H01L 21/20* | (2006.01) |
| *H01L 21/336* | (2006.01) |
| *H01L 21/36* | (2006.01) |
| *H01L 29/205* | (2006.01) |
| *H01L 21/02* | (2006.01) |
| *H01L 29/10* | (2006.01) |

(52) U.S. Cl.
CPC ...... *H01L 29/0607* (2013.01); *H01L 21/02546* (2013.01); *H01L 29/0649* (2013.01); *H01L 29/0653* (2013.01); *H01L 29/0661* (2013.01); *H01L 29/0688* (2013.01); *H01L 29/1033* (2013.01); *H01L 29/12* (2013.01); *H01L 29/205* (2013.01); *H01L 29/785* (2013.01)

(58) Field of Classification Search
None
See application file for complete search history.

(56) References Cited

U.S. PATENT DOCUMENTS

| 8,143,646 B2 | 3/2012 | Hudait et al. |
| 8,258,498 B2 | 9/2012 | Majhi et al. |
| 8,519,436 B2 * | 8/2013 | Lochtefeld ........ H01L 21/02381 257/190 |
| 8,624,326 B2 | 1/2014 | Chen et al. |
| 8,637,384 B2 | 1/2014 | Ando et al. |

(Continued)

FOREIGN PATENT DOCUMENTS

| KR | 1020070038621 A | 4/2007 |
| KR | 1020090042122 A | 4/2009 |

OTHER PUBLICATIONS

International Search Report and Written Opinion for International Application No. PCT/US2015132452 dated Aug. 28, 2015.

*Primary Examiner* — Joseph Schoenholtz
(74) *Attorney, Agent, or Firm* — Patterson & Sheridan, LLP

(57) ABSTRACT

Embodiments of the present disclosure relate to semiconductor devices such as transistors used for amplifying or switching electronic signals. In one embodiment, a first trench is formed in a dielectric layer formed on a substrate to expose a surface of the substrate, a multi-stack layer structure is formed within the first trench, and a third semiconductor compound layer is formed on the second semiconductor compound layer, wherein the second semiconductor compound layer has an etching resistance against an etchant lower than that of the first and third semiconductor compound layers, a second trench is formed in the dielectric layer to partially expose at least the second semiconductor compound layer and the third semiconductor compound layer, and the second semiconductor compound layer is selectively removed so that the first semiconductor compound layer is isolated from the third semiconductor compound layer by an air gap.

21 Claims, 3 Drawing Sheets

(56) References Cited

U.S. PATENT DOCUMENTS

| | | |
|---|---|---|
| 2008/0194083 A1 | 8/2008 | Son et al. |
| 2009/0224291 A1 | 9/2009 | Knall |
| 2013/0017654 A1 | 1/2013 | Huang et al. |
| 2013/0069159 A1 | 3/2013 | Cheng et al. |
| 2013/0087802 A1 | 4/2013 | Kohno et al. |
| 2013/0092958 A1* | 4/2013 | Chen ............... H01L 29/2003 257/77 |
| 2014/0001519 A1 | 1/2014 | Dewey et al. |
| 2014/0264438 A1* | 9/2014 | Holland ............ H01L 29/205 257/190 |

* cited by examiner

FIG. 2F (Alternative Embodiment)

METHOD OF FORMING III-V CHANNEL

FIELD

Embodiments of the present disclosure generally relate to circuit devices and fabrication of circuit devices.

BACKGROUND

Size reduction of metal-oxide-semiconductor field-effect transistors (MOSFETs) has enabled the continued improvement in speed performance, density, and cost per unit function of integrated circuits. Semiconductor industry is also in the era of transitioning from 2D transistors, which are often planar, to 3D transistors using a three-dimensional gate structure. In 3D gate structures, the channel, source and drain are raised out of the silicon substrate and the gate is wrapped around the channel on three sides. One such type of 3D transistors is known as FinFET (Fin field-effect transistor), in which the channel connecting the source and drain is a thin "fin" jutting out of the substrate. The gate controls a flow of charge carriers in the channel more strongly because it extends over three sides of the fin shaped channel, rather than only across the top of a more traditional planar channel. This results in the current being constrained to the raised channel, thereby preventing electrons from leaking.

Group III-V compound semiconductor materials have been used for forming the fin channel structure due to their higher electron mobility and saturation velocity than silicon. However, the epitaxial growth of III-V compound semiconductor materials upon silicon substrate presents challenges and problems. For example, crystal defects are generated due to lattice mismatch and thermal mismatch between the III-V epitaxial layer (i.e., the fin channel structure) and the silicon substrate. When the lattice mismatch exceeds a few percent, the strain induced by the mismatch develops at the III-V epitaxial layer and substrate interface as well as in the III-V epitaxial layer and generates defects, which could be in the form of dislocations or stacking faults.

Various buffer layers and barrier layers have been utilized between the III-V epitaxial layer and the silicon substrate in attempts to accommodate or relieve the strain induced by the lattice mismatch between the III-V epitaxial layer and the silicon substrate. In practice, however, these buffer layers and barrier layers are unable to completely prevent dislocations and stacking faults from propagating into the III-V epitaxial layer. In addition, it has also been observed that a leakage path from the source to the drain of the transistor may develop in the barrier and/or buffer layers, which causes increased off-state leakage current and degrades the ability of the transistor to completely turn off. As a result, the performance of the transistors is degraded.

Therefore, there is a need in the art to provide an improved fabrication technique for transistors to prevent undesired leakage and defects generated between the III-V epitaxial layer and the silicon substrate.

SUMMARY

Embodiments of the present disclosure relate to methods of manufacturing semiconductor devices such as transistors used for amplifying or switching electronic signals. In one embodiment, a method for forming a semiconductor device is provided. The method includes forming a first trench in a dielectric layer formed on a substrate to expose a surface of the substrate, forming a multi-stack layer structure within the first trench, comprising forming a first semiconductor compound layer over the surface of the substrate, forming a second semiconductor compound layer on the first semiconductor compound layer, and forming a third semiconductor compound layer on the second semiconductor compound layer, wherein the second semiconductor compound layer has an etching resistance against an etchant lower than that of the first and third semiconductor compound layers, forming a second trench in the dielectric layer to partially expose at least the second semiconductor compound layer and the third semiconductor compound layer, and selectively removing the second semiconductor compound layer so that the first semiconductor compound layer is isolated from the third semiconductor compound layer by an air gap.

In another embodiment, a semiconductor device is provided. The semiconductor device comprises a first dielectric section disposed on a surface of a substrate, the first dielectric section having two opposing portions extended upwardly from a top surface of the first dielectric section, and the two opposing portions defining a first trench therebetween, a second dielectric section disposed on the surface of the substrate, the second dielectric section having two opposing portions extended upwardly from the top surface of the second dielectric section, and the two opposing portions defining a second trench therebetween, a first group III-V semiconductor compound layer disposed over the surface of the substrate between the first dielectric section and the second dielectric section, a second group III-V semiconductor compound layer disposed above the first group III-V semiconductor compound layer and isolated from the first group III-V semiconductor compound layer by an air gap, wherein opposing ends of the second group III-V semiconductor compound layer are supported between the two opposing portions of the first dielectric section and the two opposing portions of the second dielectric section, a gate dielectric layer wrapped around exposed surfaces of the second group III-V semiconductor compound layer between the opposing ends, and a metal gate disposed substantially all around at least a portion of the gate dielectric layer.

In yet another embodiment, a semiconductor device prepared by a process comprising forming a first trench in a dielectric layer disposed on a substrate to expose a surface of the substrate within the first trench, forming a first semiconductor compound layer over the surface of the substrate within the first trench, forming a second semiconductor compound layer on the first semiconductor compound layer, forming a third semiconductor compound layer on the second semiconductor compound layer, wherein the second semiconductor compound layer has an etching resistance against an etchant lower than that of the first and third semiconductor compound layers, forming a second trench in the dielectric layer to partially expose at least the second semiconductor compound layer and the third semiconductor compound layer, wherein the second trench extends in a direction substantially perpendicular to that of the first trench, and selectively removing the second semiconductor compound layer so that the first semiconductor compound layer is isolated from the third semiconductor compound layer by an air gap.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not

FIG. 2F depicts the substrate of FIG. 2D removing the insulator or barrier layer from an air gap formed between the channel layer and the buffer layer according to an alternative embodiment.

Figure 1:
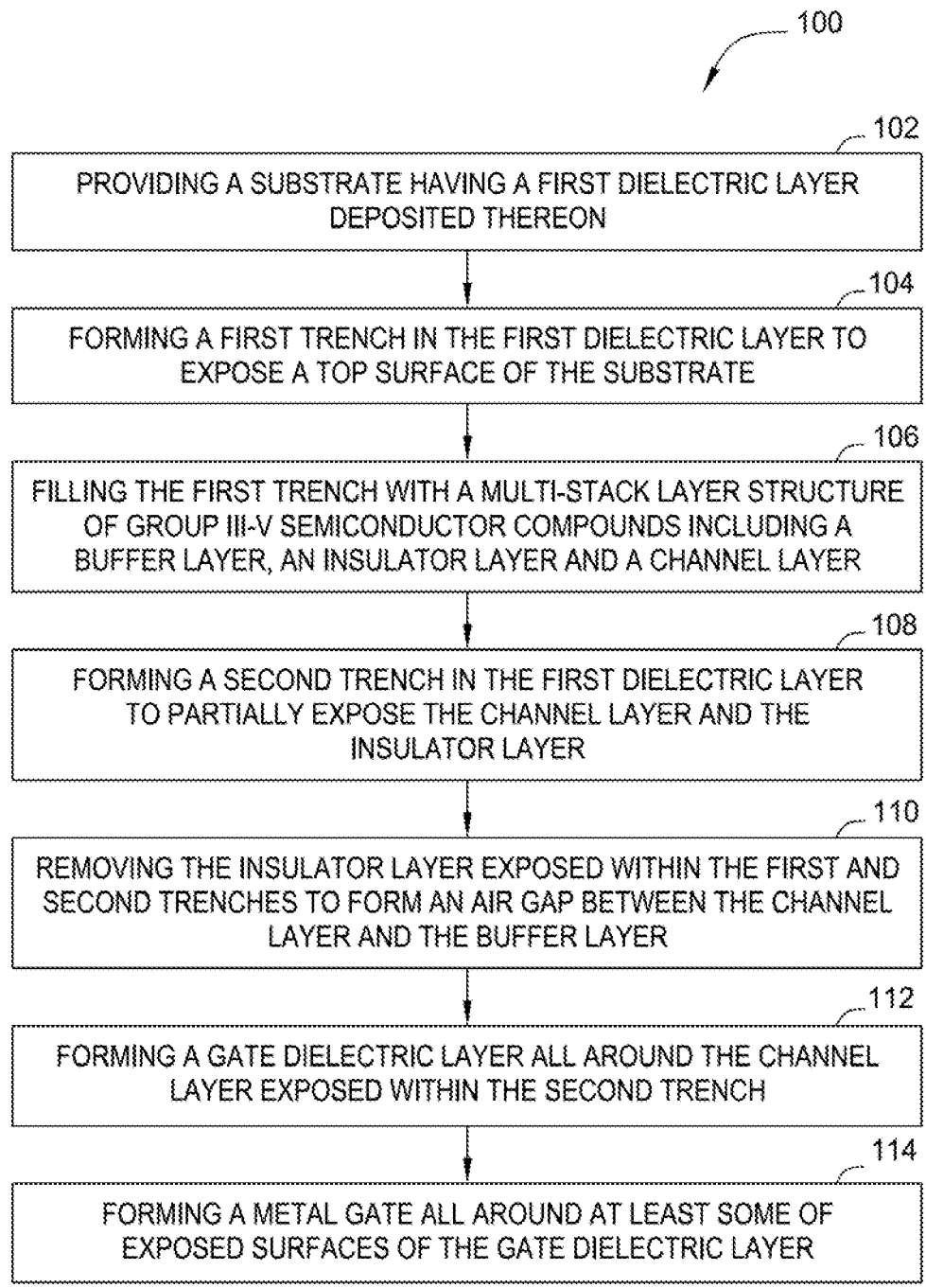
FIG. 1 depicts a flow chart of a method for manufacturing a gate stack structure according to embodiments of the disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provides methods for manufacturing semiconductor devices such as transistors used for amplifying or switching electronic signals. For example, the inventive methods may be utilized in the manufacture of CMOS (Complementary Metal-Oxide-Semiconductor) transistors. While embodiments described in this disclosure use a general term "gate stack structure" as an example, it should be understood that embodiments of the present disclosure may be equally applicable to any integral circuit devices incorporating a gate structure, or any integral circuit devices having transistors (2D or 3D) or multiple gate structures.

Figure 2A:
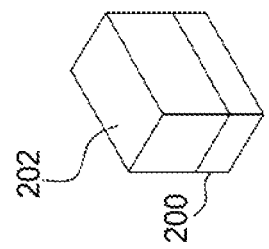
FIG. 2A depicts a perspective view of an exemplary substrate having a first dielectric layer deposited thereon.

FIG. 1 depicts a flow chart of a method 100 for manufacturing a gate stack structure according to embodiments of the disclosure. FIG. 1 is illustratively described with reference to FIGS. 2A-2G, which show perspective views of an exemplary, simplified gate stack structure during various stages of fabrication according to the flow chart of FIG. 1. The method 100 begins at block 102, where a substrate 200 is provided and a first dielectric layer 202 is deposited on the substrate, as shown in FIG. 2A. In this disclosure, the term substrate is intended to broadly cover any object that can be processed in a process chamber. The substrate 200 may be any substrate capable of having material deposited thereon, such as a silicon substrate, for example silicon (doped or undoped), crystalline silicon (e.g., Si<100> or Si<111>), silicon oxide, strained silicon, doped or undoped polysilicon, or the like, germanium, a III-V compound substrate, a silicon germanium (SiGe) substrate, an epi substrate, a silicon-on-insulator (SOI) substrate, a carbon doped oxide, a silicon nitride, a display substrate such as a liquid crystal display (LCD), a plasma display, an electro luminescence (EL) lamp display, a solar array, solar panel, a light emitting diode (LED) substrate, a patterned or non-patterned semiconductor wafer, glass, sapphire, or any other materials such as metals, metal alloys, and other conductive materials. In some embodiments, the substrate 200 may include a p-type or n-type conductivity region defined therein (not shown), depending upon the type of the transistor (N-MOS or P-MOS) to be formed on the substrate. Additionally or alternatively, the substrate 200 may include a plurality of field isolation regions (not shown) formed in the substrate 200 to isolate wells having different conductivity types (e.g., n-type or p-type) and/or to isolate adjacent transistors (not shown). In some embodiments, the field isolation regions may be shallow trench isolation (STI) structures formed, for example, by etching a trench into the substrate 200 and then filling the trench with a suitable insulator, such as silicon oxide (oxide), silicon nitride (nitride), or the like.

In some embodiments, the substrate 200 may include other structures or features at least partially formed therein. For example, in some embodiments, a feature such as a via, a trench, a dual damascene feature, high aspect ratio feature, or the like, may be formed within the substrate 200 through any suitable process or processes, such as an etch process.

The first dielectric layer 202 may include silicon dioxide or carbon doped silicon oxides. Alternatively, the first dielectric layer 202 may include high-k dielectric materials such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, and/or combinations thereof. The first dielectric layer 202 may be formed by any suitable deposition technique such as a chemical vapor deposition (CVD), a physical vapor deposition (PVD), atomic layer deposition (ALD), high density plasma CVD, or a thermal oxidation process.

Figure 2B:
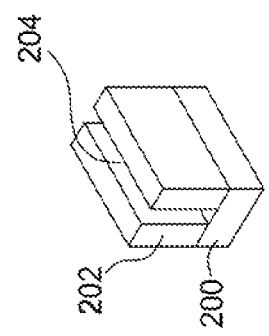
FIG. 2B depicts the substrate of FIG. 2A having a first trench formed in the first dielectric layer.

At block 104, a first trench 204 is formed in the first dielectric layer 202, as shown in FIG. 2B. The formation of the first trench 204 may include patterning a mask layer and etching the first dielectric layer using the mask layer such that a top surface of the substrate is exposed at the bottom of the first trench 204. The trench wall of the first trench 204 is the first dielectric layer 202. The etching process may include a wet etching, a dry etching process, or a combination thereof. In cases where a dry etching process is desired, the dry etching process may include forming a photoresist layer, patterning the photoresist layer, etching the first dielectric layer 202, and removing the photoresist layer. The dry etching process used to etch the first dielectric layer 202 may include a chemistry comprising fluorine-containing gas, such as $CF_4$, $SF_6$, or $NF_3$.

Figure 2C:
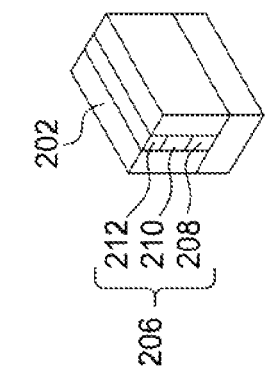
FIG. 2C depicts the substrate of FIG. 2B having the first trench sequentially filled with a buffer layer, an insulator or barrier layer, and a channel layer.

At block 106, the first trench 204 is filled with a multi-stack layer structure of group III-V semiconductor compounds 206, as shown in FIG. 2C. The multi-stack layer structure of the group III-V semiconductor compounds 206 may include a buffer layer 208, an insulator or barrier layer 210, and a channel layer 212, which may be sequentially filled within the first trench 204 using any suitable deposition techniques, for example a metalorganic chemical vapor deposition (MOCVD), an epitaxy process such as an atomic layer epitaxy (ALE), or molecular beam epitaxy (MBE). In one embodiment, the buffer layer 208 may be in physical contact with the exposed surface of the substrate 200. The insulator or barrier layer 210 may be in physical contact with the buffer layer 208. The channel layer 212 may be in physical contact with the insulator or barrier layer 210. The buffer layer 208 may be deposited such that it partially or substantially fills the first trench 204 and then a portion of the deposited buffer layer may be removed by an etching process to obtain a desired thickness of the buffer layer 208 within the first trench 204. The similar deposition/etching process may be performed on the insulator or barrier layer 210 and the channel layer 212. Thereafter, a planarizing process may be performed on the substrate 200 to remove excess material of the layer from the surface of the substrate 200.

In various embodiments, the compositions of the buffer layer 208, the insulator or barrier layer 210 and the channel layer 212 are chosen such that a conduction band offset of the channel layer 212 and a band offset of the barrier layer have opposite type with respect to the buffer layer 208 to repel or confine electron carriers in the channel layer 212. While the buffer layer 208 and the insulator or barrier layer 210 are shown as a single layer, each of the buffer layer 208 and the insulator or barrier layer 210 may include two or more layers, of which the composition and the thickness are selected depending upon the lattice constant and lattice mismatch between the substrate 200 and the channel layer 212. As discussed previously, when the lattice mismatch between the substrate and the channel layer exceeds a few percent, the strain induced by the mismatch becomes too great and defects are generated in the channel layer. Therefore, a buffer layer consists of a graded composition (i.e., a multi-layer structure having a lattice constant which gradually changes from the lattice constant of the first layer to that of the $N^{th}$ layer in the structure) may help relax lattice mismatch between the substrate and the channel layer. For example, in cases where the buffer layer is comprised of a GaAs layer formed between a silicon substrate and an InGaAs channel layer, the 5.65 Å lattice constant of GaSb layer is approximately 4% larger than the 5.43 Å lattice constant of the silicon substrate upon which the GaAs buffer layer is formed. The 5.88 Å lattice constant of the InGaAs channel layer is approximately 4% larger than the GaAs buffer layer. Thus, in this particular embodiment, the lattice constant of the buffer layer incremented the overall lattice spacing of the silicon substrate to the lattice spacing of the channel layer, thereby partitioning the lattice mismatch between two separate material interfaces. In this manner, the InGaAs channel layer need only accommodate the strain of 4% lattice mismatch with the GaAs buffer layer, rather than the entire 8.28% mismatch with the silicon substrate.

The buffer layer 208 may employ wide bandgap material to provide a sufficiently large conduction band offset ($\Delta Ec$) with the conduction band of the channel layer 212 to repel electron carriers, thereby reducing the current leakage between the channel layer 212 and the buffer layer 208. In one example, the greatest conduction band offset may be between about 0.05 eV and about 0.8 eV. The buffer layer 208 may be any suitable material selected with consideration of lattice constant, band gap and melting point for the purpose of controlling nucleation and propagation of defects generated by lattice mismatch strain. In some embodiments, the buffer layer 208 may be formed of a higher bandgap material than the substrate 200. In one embodiment, the buffer layer 208 is a group III-V semiconductor compound having a crystal structure. In various examples, the buffer layer may be or include InAlAs, InP, InGaAs, InAs, InSb, GaAs, AlAs, or GaSb. The buffer layer 208 can be unintentionally doped, doped, heavily-doped p-type or n-type, semi-insulating, or undoped. The buffer layer 208 may have a thickness of about 10 nm to about 100 nm, for example about 20 nm to about 60 nm. Other materials such as group II-VI semiconductor compounds, binary compounds from Groups II-VI or Groups III-V, ternary compounds from Groups II-VI or Groups III-V, quaternary compounds from Groups II-VI or Groups III-V, or mixtures or combinations thereof, may also be used.

The insulator or barrier layer 210 may be any suitable material selected to provide a barrier to charge carriers in the transistor channel. In one embodiment, the insulator or barrier layer 210 may be a group III-V semiconductor compound having a crystal structure. The insulator or barrier layer 210 may be or include AlAsSb, InAlAs, AlGaAs, InP, InAlSb, or the like. Other materials such as group II-VI semiconductor compounds, binary compounds from Groups II-VI or Groups III-V, ternary compounds from Groups II-VI or Groups III-V, quaternary compounds from Groups II-VI or Groups III-V, or mixtures or combinations thereof, may also be used. It is contemplated that the insulator or barrier layer 210 may be any suitable material which can be selectively etched removed. The insulator or barrier layer 210 may have a thickness of about 2 nm to about 60 nm, for example about 10 nm to about 30 nm.

The channel layer 212 may be a group III-V semiconductor compound such as InAs, InGaAs, InGaSb, InP, InAlSb, GaSb, or the like. In some embodiments, the channel layer 212 may be or include Ge or SiGe. Other materials such as group II-VI semiconductor compounds, binary compounds from Groups II-VI or Groups III-V, ternary compounds from Groups II-VI or Groups III-V, quaternary compounds from Groups II-VI or Groups III-V, or mixtures or combinations thereof, may also be used. The channel layer 212 may have a thickness of about 1 nm to about 50 nm, for example about 5 nm to about 15 nm.

While the buffer layer 208, the insulator or barrier layer 210, and the channel layer 212 may all be formed of a group III-V semiconductor compound, the insulator or barrier layer 210 is selected to have an etching resistance against an etchant significantly lower than that of the buffer layer 208 and the channel layer 212 so that the insulator or barrier layer 210 can be selectively etched at an etching rate significantly higher than the buffer layer 208 and the channel layer 212, as will be discussed in more detail below with respect to block 110. In various examples, the etch selectivity ratio on the insulator or barrier layer 210 to the channel layer 212 may be about 100:1 to about 6000:1, for example about 1000:1 to about 3000:1. The etch selectivity ratio on the insulator or barrier layer 210 to the buffer layer 208 may be about 100:1 to about 6000:1, for example about 1000:1 to about 3000:1.

In certain embodiments, a nucleation layer (not shown) may be optionally formed between the buffer layer 208 the substrate 200 to further reduce the lattice mismatch between the substrate 200 and the subsequently deposited layer such as the buffer layer 208. The nucleation layer may be a group III-V semiconductor compound such as GaSb, GaAs, GaN, AlN, AlGaN, or the like.

Figure 2D:
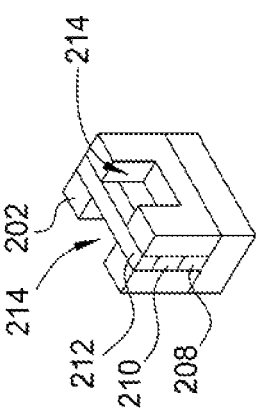
FIG. 2D depicts the substrate of FIG. 2C having a second trench formed in the first dielectric layer.

At block 108, after filling the first trench 204 with the multi-stack layer structure of the group III-V semiconductor compounds 206, a second trench 214 is formed in the first dielectric layer 202. The second trench 214 may have a thickness sufficiently to partially expose the channel layer 212 and the insulator or barrier layer 210 within the second trench 214, as shown in FIG. 2D. In one embodiment, the second trench 214 may have a thickness or height of about total height of the insulator or barrier layer 210 and the channel layer 212. The second trench 214 may be extended laterally in a direction substantially perpendicular to that of the first trench 204. The formation of the second trench 214 may include patterning a hard mask layer and etching the first dielectric layer 202 using the hard mask layer, resulting in first dielectric sidewalls 202a, 202b, 202c, 202d.

Figure 2E:
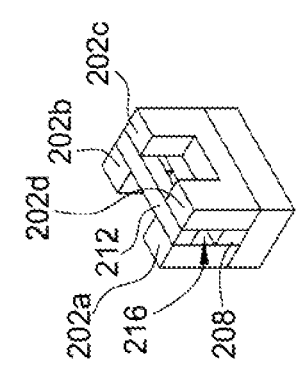
FIG. 2E depicts the substrate of FIG. 2D removing the insulator or barrier layer from the first and second trenches.

At block 110, the insulator or barrier layer 210 exposed within the first and second trenches 204, 214 is removed, as shown in FIG. 2E. The insulator or barrier layer 210 may be removed using a selective etch process so that the channel layer 212 remains substantially intact after the selective etch process. The selective etch process may use wet etchants or dry etchants, depending upon the application. In either case, the etchants should exhibit a high etch rate on the insulator or barrier layer 210 with a very low or zero etch rate on the channel layer 212. For instance, in one example where the channel layer 212 is InGaAs and the insulator or barrier layer 210 is InAlAs, an etchant consisting of about 3:1 ratio of HCl to water may be used. The etch selectivity ratio on InAlAs to InGaAs has been observed to be highly selective (i.e., over 2000:1) using the etchant containing 3:1 HCl to water. The etchants used for the selective etch process may vary depending upon the materials to be removed. More selective etch process for chemical etching of III-V semiconductor materials may be found in "GUIDE TO REFERENCES ON III-V SEMICONDUCTOR CHEMICAL ETCHING" by Clawson, A. R., et al., published by Materials Science and Engineering 2001, Issue 31, pages 1-438.

The insulator or barrier layer 210 may be removed completely from the structure to form an air gap 216 between the channel layer 212 and the buffer layer 208, as shown in FIG. 2F. The air gap 216 may have a height of about twice the thickness of the channel layer 212. Alternatively, the insulator or barrier layer 210 may be removed partially, i.e., only the insulator or barrier material presented within the second trench 214 is removed, as shown in FIG. 2E. In either case, the channel layer 212, which is in substantial parallel relationship to the buffer layer 208, is generally held by sidewalls of the first dielectric layer 202. That is, the two opposing ends of the channel layer 212 are supported by the first dielectric sidewalls 202a, 202d and 202b, 202c, respectively, once the selective etch process is completed. By removing the insulator or barrier layer 210 (either partially or completely), the channel layer 212 is substantially isolated (physically and/or electrically) from the buffer layer 208 by an air gap 216. As a result, a current leakage path that would otherwise develop in the insulator or barrier layer 210 or in buffer layer 210 is no longer a concern because the insulator or barrier layer 210 is removed. The air gap created between the buffer layer 208 and the channel layer 212 not only helps confine the electron carriers in the channel layer 212 but also minimizes or avoids the off-state leakage current, which in turn improves the ability of the transistor to completely turn off.

Figure 2G:
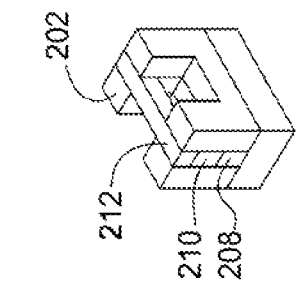
FIG. 2G depicts the substrate of FIG. 2E having a gate dielectric layer selectively formed all around the channel layer exposed within the second trench.
Figure 2G:
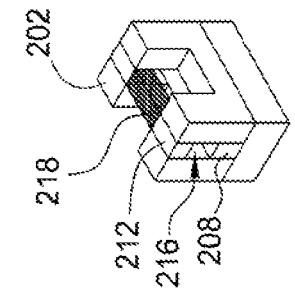

At block 112, once the gap 216 has been created to physically and electrically isolate the buffer layer 208 from the channel layer 212, a gate dielectric layer 218 is selectively formed all around the channel layer 212 exposed within the second trench 214, as shown in FIG. 2G. In one embodiment, at least a portion between two opposing ends of the channel layer 212 is wrapped around by the gate dielectric layer 218. Specifically, a top surface, a bottom surface, and two opposing side surfaces of the channel layer 212 exposed within the second trench 214 are covered by the gate dielectric layer 218. The gate dielectric layer 218 may be a single film of oxides, nitrides, or using the material listed below. Alternatively, the gate dielectric layer 218 may be a film stack comprising two or more layers, where the layers could be any combination of materials like oxides and nitrides, or any combination of materials listed below. In one embodiment, the gate dielectric layer 218 may be a high-K dielectric material having a dielectric value greater than about 3.9. Suitable materials for the gate dielectric layer 218 may include, but are not limited to hafnium oxide ($HfO_x$), hafnium silicon oxide ($HfSiO_x$), hafnium silicon oxynitride ($HfSiO_xN_y$), hafnium aluminum oxide ($HfAlO_x$), aluminum oxide ($Al_2O_3$), tantalum pentoxide ($Ta_2O_5$), titanium dioxide ($TiO_2$), zirconium oxide ($ZrO_2$), hafnium zirconium oxide ($HfZrO_2$), lanthanum oxide ($La_2O_3$), yttrium oxide ($Y_2O_3$) and their aluminates and silicates. The gate dielectric layer 218 may be other suitable materials such as titanium aluminum alloy, tantalum aluminum alloy, titanium nitride, titanium silicon nitride, titanium aluminum nitride, tantalum nitride, tantalum silicon nitride, hafnium nitride, hafnium silicon nitride, aluminum nitride, or a combination thereof. Depending upon the material of the layer to be formed, a suitable process, such as atomic layer deposition (ALD) techniques, wet or dry thermal oxidation process, chemical vapor deposition (CVD) techniques, plasma enhanced chemical vapor deposition (PECVD) techniques, physical vapor deposition (PVD) techniques, or combinations thereof, may be used to form the gate dielectric layer 218. The gate dielectric layer 218 may have an appropriate P-type work function, or an appropriate N-type work function for a MOS device.

In some embodiments, once the gate dielectric layer 218 has been formed all around the channel layer 212, the gap 216 and the second trench 214 may be left open as shown, or may be filled and covered with a sacrificial dielectric material to temporarily protect the structure. The sacrificial dielectric material can be organic or inorganic and the key requirement being compatibility with ease of the metal gate processing as described below and ease of subsequent removal with no damage to the structure (including the buffer layer 208 and the channel layer 212). The sacrificial dielectric material may include, but is not limited to oxides, silicon oxides, silicon dioxides, silicon nitrides, or organic polymers such as polyimides and polyarylene ethers and combination thereof or equivalents. Alternatively, the application of the sacrificial dielectric material may be performed after the gap 216 has been created but prior to the formation of the gate dielectric layer 218.

Figure 2H:
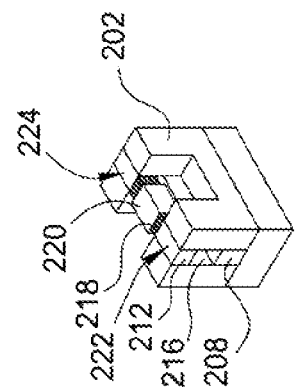
FIG. 2H depicts the substrate of FIG. 2G having a metal gate formed substantially all around at least some of the exposed surfaces of the gate dielectric layer.

At block 114, a metal gate 220 is formed substantially all around at least some of the exposed surfaces of the gate dielectric layer 218, as shown in FIG. 2H. Specifically, the metal gate 220 is formed around a top surface, a bottom surface, and two opposing side surfaces of the gate dielectric layer 218 exposed within the second trench 214. The transistor device that utilizes a wrap-around metal gate structure advantageously scales the contact area for a given size and length of the channel layer 212. By surrounding the gate dielectric layer 218 (and thus the channel layer 212), the metal gate 220 can exert more control over the channel layer 212 and better control on and/or off states of the transistor device, among other things, even in view of short channel effects.

The metal gate 220 traverses the channel layer 212, defining a source region 222 and a drain region 224 for the gate stack structure. The resulting source region 222 and the drain region 224 are formed on opposite sides of the channel layer 212. The source region 222 and the drain region 224 may be doped with n-type impurities (such as Si) or p-type impurities (such as Zn or Mg) using an ion implantation process. The ion implantation process may be performed subsequent to the formation of the metal gate 220, or during or subsequent to the deposition growth of the channel layer 212. An annealing process may be performed to activate the dopants in the source and drain regions 222, 224. The metal gate 220 permits or shuts off the current flowing from the source region 222 to the drain region 224 by controlling voltage applied to the metal gate 220. The metal gate 220 may have a thickness suitable to provide the appropriate work function for the semiconductor device being processed. For example, the metal gate 220 may have a thickness of about 10 Angstroms (Å) to several hundred Å, for example about 20 Å to about 100 Å.

In various embodiments, the metal gate 220 may include a metal, a metal alloy, a metal nitride, a metal silicide, or a metal oxide. In some embodiments, the metal gate 220 may contain titanium, titanium aluminum alloy, tantalum, tantalum aluminum alloy, titanium nitride, titanium silicon nitride, titanium aluminum nitride, tantalum nitride, tantalum silicon nitride, hafnium nitride, hafnium silicon nitride, aluminum nitride, aluminum oxide, tungsten, platinum, aluminum, ruthenium, molybdenum, other conductive materials, or a combination thereof. It should be appreciated that metal gate 220 need not necessarily be a single material, but could comprise a composite stack of thin films using materials discussed herein. In some embodiments, the composite stack of metal gate 220 may further include a polycrystalline silicon. Depending upon the material of the layer to be formed, a suitable process, such as atomic layer deposition (ALD) techniques, chemical vapor deposition (CVD) techniques, plasma enhanced chemical vapor deposition (PECVD) techniques, physical vapor deposition (PVD) techniques, or combinations thereof, may be used to form the metal gate 220.

If the gap 216 and the second trench 214 were filled and covered with the sacrificial dielectric material prior to the metal gate formation, a hard mask layer may be deposited on the sacrificial dielectric material and patterned using photolithography and etching processes to transfer a desired trench pattern into the sacrificial dielectric material. The trench pattern may be less wider than the diameter of the gate dielectric layer 218. Thereafter, the sacrificial dielectric material may be etched away using any suitable process such as reactive ion etching or other anisotropic etching techniques to expose the gate dielectric layer 218 for the subsequent processing of the metal gate 220. After the wrap-around metal gate is formed, the sacrificial dielectric material may be removed and the substrate 200 may be further processed as necessary to form any additional structures or features required to complete the gate stack structure for the transistor.

Figure 3:
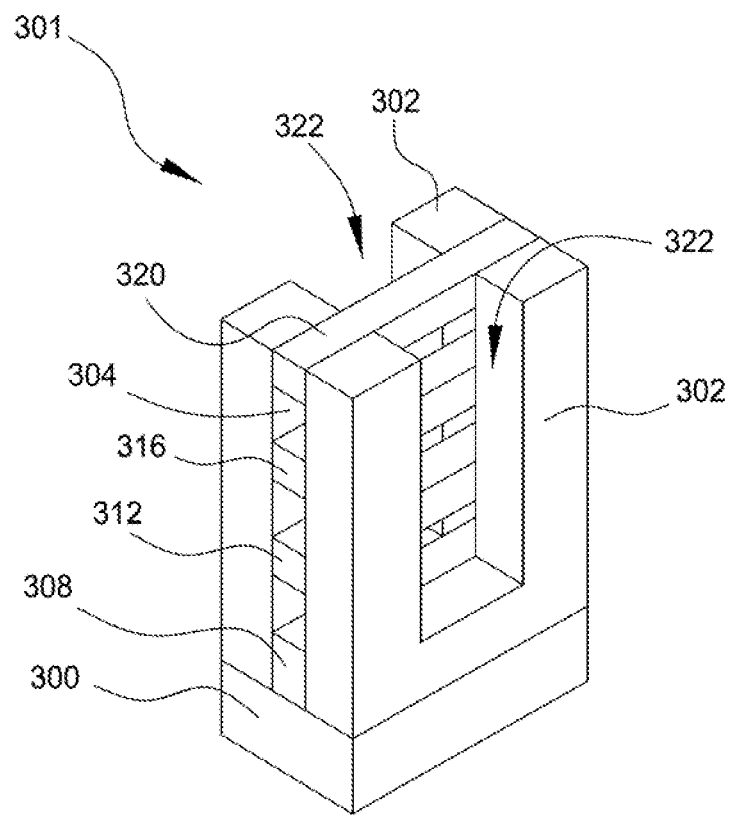
FIG. 3 depicts a perspective view of an exemplary, simplified multi-channel gate stack structure according to embodiments of the disclosure.

To increase current capability of the transistor device, in some embodiments a multi-channel gate stack structure may be employed. FIG. 3 depicts a perspective view of an exemplary, simplified multi-channel gate stack structure 301 according to embodiments of the disclosure. The multi-channel gate stack structure 301 may be formed by providing a substrate 300 having a first dielectric layer 302 formed thereon. The substrate 300 and the first dielectric layer 302 may be the same material used for substrate 200 and first dielectric layer 202 as discussed above with respect to FIG. 1. A first trench 304 may be formed in the first dielectric layer 302 in a way similar to block 104 as discussed above. The first trench 304 should have a height or thickness sufficient to form the desired number of channel layers for the multi-channel gate stack.

The first trench 304 is then filled with a multi-stack layer structure of group III-V semiconductor compounds, in a way similar to block 106 as discussed above. In one embodiment, the multi-stack layer structure of group III-V semiconductor compounds may include at least a buffer layer 308 formed over the substrate 300, and a plurality of insulator or barrier layers and channel layers alternatingly formed on the buffer layer 308 until a desired number of channel layers are obtained. In one embodiment, the first trench 304 is filled with a first insulator or barrier layer (not shown) formed on the buffer layer 308, a first channel layer 312 formed on the first insulator or barrier layer, a second insulator or barrier layer (not shown) formed on the first channel layer 312, a second channel layer 316 formed on the second insulator or barrier layer, a third insulator or barrier layer (not shown) formed on the second channel layer 316, and a third channel layer 320 formed on the third insulator or barrier layer. The buffer layer 308, the first, second and third insulator or barrier layers, and the first, second and third channel layers 312, 316, 320 may be the same material as the buffer layer 208, the insulator or barrier layer 210, and the channel layer 212 formed using any suitable deposition techniques as discussed above with respect to block 106.

Once the multi-stack layer structure of group III-V semiconductor compounds has been filled within the first trench 304, a second trench 322 is formed in the first dielectric layer 302 to partially expose the plurality of insulator or barrier layers and channel layers within the second trench 322. The second trench 322 may have a thickness or height of about total height of the plurality of insulator or barrier layers and the channel layers. Similarly, the second trench 322 may be extended laterally in a direction substantially perpendicular to that of the first trench 304. Thereafter, all the first, second and third insulator or barrier layers exposed within the first and second trenches 304, 322 are removed, as shown in FIG. 3. Alternatively, it may be only the first, second and third insulator or barrier layers exposed within the second trench 304 removed from the multi-channel gate stack structure 301. In either case, the insulator or barrier layers are removed using a selective etch process as discussed above with respect to block 110 so that the first, second and third channel layers 312, 316, 320 remain substantially intact after the selective etch process. Upon completion of the selective etch process, the first, second and third channel layers 312, 316, 320 are held parallel to each other by the first dielectric layer 302 in a way similar to those discussed at block 110. The first, second and third channel layers 312, 316, 320 are also separated from each other by an air gap.

By removing all the insulator or barrier layers from the multi-channel gate stack structure 301, each of the channel layers 312, 316, 320 is physically isolated from the buffer layer 308 (i.e., free from contacting the buffer layer 308). As a result, a current leakage path that would otherwise develop in the insulator or barrier layer or in buffer layer 308 is no longer a concern because the insulator or barrier layers are removed. The air gap created between the buffer layer 208 and each of the channel layers 312, 316, 320 not only helps confine the electron carriers in each channel layer 312, 316, 320 but also minimizes or avoids the off-state leakage current, which in turn improves the ability of the transistor to completely turn off.

Embodiments of the present disclosure provide an effective way of current leakage control for a gate stack structure by physically isolating the channel layer from the buffer layer. Contrary to conventional gate stack structures having an insulator or barrier layer formed between and in physical contact with the channel layer and the buffer layer, the present disclosure proposes selectively removing the insulator or barrier layer from the gate stack structure. Therefore, the channel layer and the buffer layer are physically isolated from each other by an air gap created due to removal of the insulator or barrier layer. As a result, a current leakage path that would otherwise develop in the insulator or barrier layer or in buffer layer is no longer a concern because no insulator or barrier layer is provided between the channel layer and the buffer layer. The air gap created between the buffer layer and the channel layer not only helps confine the electron carriers in the channel layer but also minimizes or avoids the off-state leakage current, which in turn improves the ability of the transistor to completely turn off.

While the foregoing is directed to embodiments of the present disclosure, other and further embodiments of the disclosure may be devised without departing from the basic scope thereof.

The invention claimed is:

1. A method of forming a semiconductor device, comprising:
    forming a first trench in a dielectric layer formed on a substrate to expose a surface of the substrate;
    forming a multi-stack layer structure within the first trench, comprising:
        forming a first semiconductor compound layer over the surface of the substrate;
        forming a second semiconductor compound layer on the first semiconductor compound layer; and
        forming a third semiconductor compound layer on the second semiconductor compound layer, wherein the second semiconductor compound layer has an etching resistance against an etchant lower than that of the first and third semiconductor compound layers;
    forming a second trench in the dielectric layer to partially expose at least the second semiconductor compound layer and the third semiconductor compound layer; and
    selectively removing the second semiconductor compound layer so that the first semiconductor compound layer is isolated from the third semiconductor compound layer by an air gap.

2. The method of claim 1, wherein the first, second, and third semiconductor compound layers are selected from the group consisting of group III-V semiconductor compounds, group II-VI semiconductor compounds, group II-VI semiconductor compounds, binary compounds from Groups II-VI or Groups III-V, ternary compounds from Groups II-VI or Groups III-V, quaternary compounds from Groups II-VI or Groups III-V, or mixtures or combinations thereof.

3. The method of claim 2, wherein the first semiconductor compound layer comprises InAlAs, InP, InGaAs, InAs, InSb, GaAs, AlAs, or GaSb.

4. The method of claim 2, wherein the second semiconductor compound layer comprises AlAsSb, InAlAs, AlGaAs, InP, or InAlSb, and the third semiconductor compound layer comprises InAs, InGaAs, InGaSb, InP, InAlSb, or GaSb.

5. The method of claim 2, wherein the third semiconductor compound layer is InGaAs and the second semiconductor compound layer is InAlAs.

6. The method of claim 5, wherein the selectively removing the second semiconductor compound layer comprises using an etchant consisting of about 3:1 ratio of HCl to water.

7. The method of claim 1, wherein selectively removing the second semiconductor compound layer removes only the second semiconductor compound layer exposed within the second trench.

8. The method of claim 1, further comprising:
    forming a gate dielectric layer all around the third semiconductor compound layer exposed within the second trench; and
    forming a metal gate all around at least a portion of exposed surfaces of the gate dielectric layer.

9. The method of claim 1, wherein the second trench extends in a direction substantially perpendicular to that of the first trench.

10. A semiconductor device, comprising:
    a first dielectric section disposed on a surface of a substrate, the first dielectric section having two opposing portions extended upwardly from a top surface of the first dielectric section, and the two opposing portions defining a first trench therebetween;
    a second dielectric section disposed on the surface of the substrate, the second dielectric section having two opposing portions extended upwardly from the top surface of the second dielectric section, and the two opposing portions defining a second trench therebetween;
    a first group III-V semiconductor compound layer disposed over the surface of the substrate between the first dielectric section and the second dielectric section;
    a second group III-V semiconductor compound layer disposed above the first group III-V semiconductor compound layer and isolated from the first group III-V semiconductor compound layer by an air gap, wherein opposing ends of the second group III-V semiconductor compound layer are supported between the two opposing portions of the first dielectric section and the two opposing portions of the second dielectric section;
    a gate dielectric layer wrapped around exposed surfaces of the second group III-V semiconductor compound layer between the opposing ends; and
    a metal gate disposed substantially all around at least a portion of the gate dielectric layer.

11. The semiconductor device of claim 10, wherein the air gap has a height of about twice the thickness of the second group III-V semiconductor compound layer.

12. The semiconductor device of claim 10, wherein the second group III-V semiconductor compound layer is substantially parallel to the first group III-V semiconductor compound layer.

13. The semiconductor device of claim 10, wherein the exposed surfaces of the second group III-V semiconductor compound layer are exposed to air through the first trench and the second trench.

14. The semiconductor device of claim 10, wherein the gate dielectric layer comprises oxides, nitrides, hafnium oxide ($HfO_x$), hafnium silicon oxide ($HfSiO_x$), hafnium silicon oxynitride ($HfSiO_xN_y$), hafnium aluminium oxide ($HfAlO_x$), aluminum oxide ($Al_2O_3$), tantalum pentoxide ($Ta_2O_5$), titanium dioxide ($TiO_2$), zirconium oxide ($ZrO_2$), hafnium zirconium oxide ($HfZrO_2$), lanthanum oxide ($La_2O_3$), yttrium oxide ($Y_2O_3$) and their aluminates and silicates, titanium aluminum alloy, tantalum aluminum alloy, titanium nitride, titanium silicon nitride, titanium aluminum nitride, tantalum nitride, tantalum silicon nitride, hafnium nitride, hafnium silicon nitride, aluminum nitride, or a combination thereof.

15. The semiconductor device of claim 10, wherein the metal gate comprises a metal, a metal alloy, a metal nitride, a metal silicide, or a metal oxide.

16. The semiconductor device of claim 10, wherein the first and second group III-V semiconductor compound layers are selected from the group consisting of group III-V semiconductor compounds, group II-VI semiconductor compounds, group II-VI semiconductor compounds, binary compounds from Groups II-VI or Groups III-V, ternary compounds from Groups II-VI or Groups III-V, quaternary compounds from Groups II-VI or Groups III-V, or mixtures or combinations thereof.

17. The semiconductor device of claim 16, wherein the first group III-V semiconductor compound layer comprises InAlAs, InP, InGaAs, InAs, InSb, GaAs, AlAs, or GaSb, and the second group III-V semiconductor compound layer comprises InAs, InGaAs, AlGaAs, InP, InGaSb, or AlSb.

18. A semiconductor device prepared by a process comprising:

forming a first trench in a dielectric layer disposed on a substrate to expose a surface of the substrate within the first trench;

forming a first semiconductor compound layer over the surface of the substrate within the first trench;

forming a second semiconductor compound layer on the first semiconductor compound layer;

forming a third semiconductor compound layer on the second semiconductor compound layer, wherein the second semiconductor compound layer has an etching resistance against an etchant lower than that of the first and third semiconductor compound layers;

forming a second trench in the dielectric layer to partially expose at least the second semiconductor compound layer and the third semiconductor compound layer, wherein the second trench extends in a direction substantially perpendicular to that of the first trench; and selectively removing the second semiconductor compound layer so that the first semiconductor compound layer is isolated from the third semiconductor compound layer by an air gap.

19. The semiconductor device of claim 18, wherein the first, second, and third semiconductor compound layers are selected from the group consisting of group III-V semiconductor compounds, group II-VI semiconductor compounds, group II-VI semiconductor compounds, binary compounds from Groups II-VI or Groups III-V, ternary compounds from Groups II-VI or Groups III-V, quaternary compounds from Groups II-VI or Groups III-V, and mixtures or combinations thereof.

20. The semiconductor device of claim 18, further comprising:

forming a gate dielectric layer all around the third semiconductor compound layer exposed within the second trench; and forming a metal gate all around at least a portion of exposed surfaces of the gate dielectric layer.

21. A method of forming a semiconductor device, comprising:

(a) forming a first trench in a dielectric layer formed on a substrate to expose a surface of the substrate;

(b) forming a buffer layer over the surface of the substrate, wherein the buffer layer comprises InAlAs, InP, InGaAs, InAs, InSb, GaAs, AlAs, or GaSb;

(c) forming an insulator layer over the buffer layer, wherein the insulator layer comprises AlAsSb, InAlAs, AlGaAs, InP, or InAlSb;

(d) forming a channel layer on the insulator layer, wherein the insulator layer has an etching resistance against an etchant lower than that of the buffer and channel layers, and the channel layer comprises InAs, InGaAs, InGaSb, InP, InAlSb, or GaSb, Ge or SiGe;

(e) repeating (c) and (d) for N times, wherein N is an integral number greater than 1;

(f) forming a second trench in the dielectric layer to partially expose at least the buffer layers and the channel layers; and (g) selectively removing the insulator layers.

* * * * *